United States Patent [19]
Kantner

[11] Patent Number: 5,847,932
[45] Date of Patent: Dec. 8, 1998

[54] STACKED IC CARD ASSEMBLY FOR INSERTION INTO STACKED RECEIVER

[75] Inventor: Edward A. Kantner, Raleigh, N.C.

[73] Assignee: ITT Manufacturing Enterprises, Inc., Wilmington, Del.

[21] Appl. No.: 962,056

[22] Filed: Oct. 31, 1997

Related U.S. Application Data

[62] Division of Ser. No. 546,356, Oct. 20, 1995, Pat. No. 5,716,221.

[51] Int. Cl.6 ...................................................... H05K 7/10
[52] U.S. Cl. ............................................................. 361/737
[58] Field of Search ............................... 439/76.1, 541.5, 439/946; 361/736, 737, 686

[56] References Cited

U.S. PATENT DOCUMENTS

| | | | |
|---|---|---|---|
| 3,692,966 | 9/1972 | Lancaster | 200/51.1 |
| 4,256,936 | 3/1981 | Lancaster | 200/51.1 |
| 4,952,758 | 8/1990 | Dara | 200/51.09 |
| 5,051,101 | 9/1991 | Komatsu | 439/159 |
| 5,260,852 | 11/1993 | Ma | 361/685 |
| 5,267,876 | 12/1993 | Rupert | 439/541.5 |
| 5,299,089 | 3/1994 | Lwee | 439/684 |
| 5,324,204 | 6/1994 | Lwee | 439/64 |
| 5,608,607 | 3/1997 | Dittmer | 361/737 |
| 5,625,534 | 4/1997 | Okaya | 361/737 |

*Primary Examiner*—Neil Abrams
*Attorney, Agent, or Firm*—Thomas L. Peterson

[57] ABSTRACT

A new IC card is described, which can fit into standard card-receiving hosts that each has a host connector with 68 contact positions; however, the new IC card has more than 68 card contacts that can mate with more than 68 host connector contacts. The new IC card is designed to be inserted into a host stack of at least two vertically-spaced hosts. The new IC card includes upper and lower card connectors that each have 68 contact positions in accordance with PCMCIA specifications, and has a card frame that holds the two card connectors at a spacing equal to the vertical spacing of the host connectors. The card frame has slots on either side to receive mid walls that form parts of the host edge guideways, the card frame also including a slot at the front between the upper and lower card contacts to receive a separation wall of the host stack which separates the host connectors. The new card can have a key that operates at least one switch on a modified host stack, to sense the insertion of the new card and couple the host connector contacts to circuitry designed to connect to the new card.

9 Claims, 3 Drawing Sheets

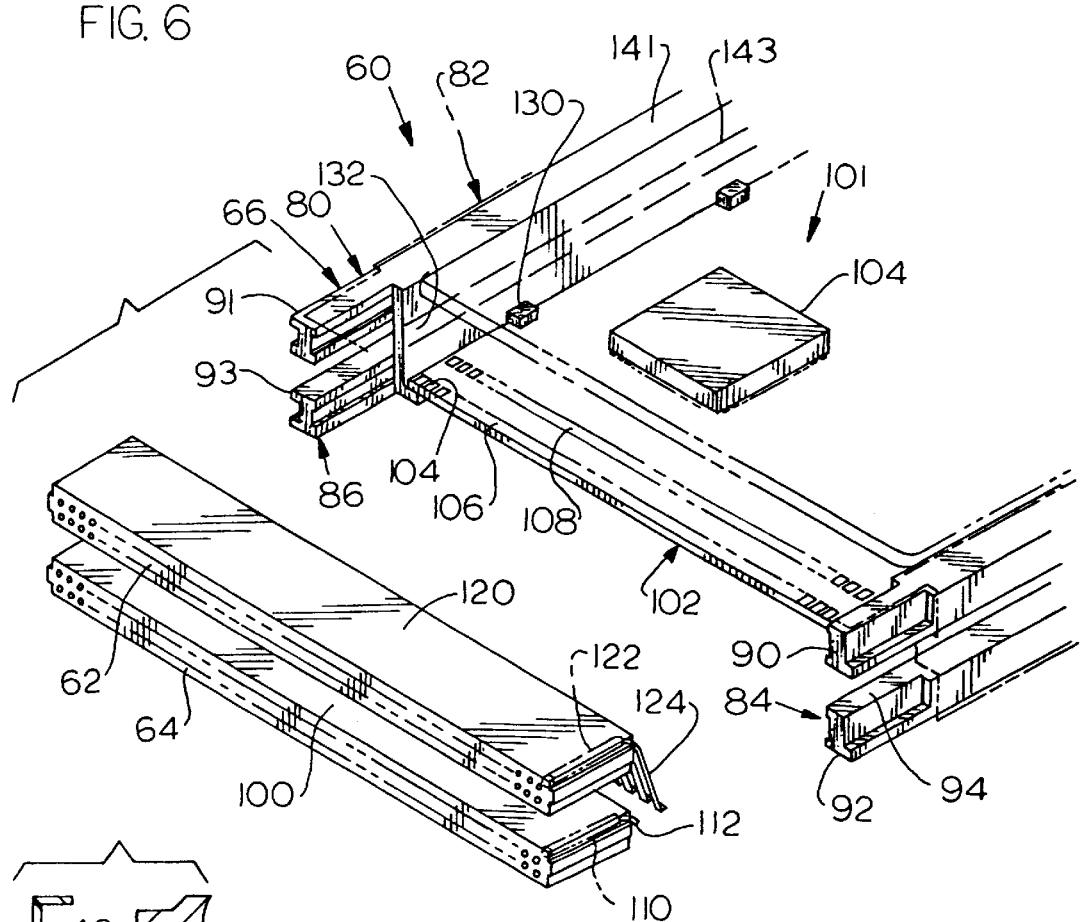
FIG. 6
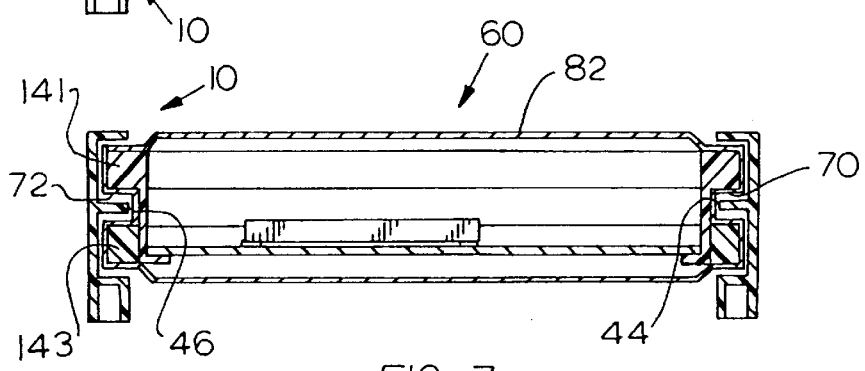
FIG. 8
FIG. 7 ns us 5,847,932

STACKED IC CARD ASSEMBLY FOR INSERTION INTO STACKED RECEIVER

CROSS REFERENCE

This is a division of U.S. patent application Ser. No. 08/546,356 filed Oct. 20, 1995, now U.S. Pat. No. 5,716,221 issued Feb. 10, 1998.

BACKGROUND OF THE INVENTION

IC (integrated circuit) cards, which are of about the same width and length as a typical credit card, are designed for insertion into a slot of a card-receiving host which may lie in an electronic device such as a notebook computer. PCMCIA (Personal Computer Memory Card International Association) specifies that card and host connectors each have 68 contact positions arranged in two vertically spaced rows of 34 positions each. It is highly desirable that any IC card be compatible with standard PCMCIA host connectors. Actually, PCMCIA standards currently specify three types of cards of different thicknesses ranging from 3.3 mm to 10.5 mm, all having standard card connectors. Type I and type II which have maximum thicknesses of 3.3 mm and 5 mm, respectively, are the most popular, and they have identical edges. It is common to provide host connectors with a stack of at least two hosts to receive two separate IC cards.

Although 68 contacts is often sufficient, there are some IC card designs which require more than 68 contacts. Although new card and host standards can be established to accommodate more than 68 contacts, this would require considerable added expense to create tooling for additional host and card connectors. Also, for an electronic device to interact with present 68-contact connectors as well as any larger connectors, would require additional room on the electronic device for two separate card-receiving areas. A new IC card which was backward compatible, in that it could utilize present 68 position card connectors and could fit into present hosts designed to mate with 68 position connectors, would be of value.

SUMMARY OF THE INVENTION

In accordance with one embodiment of the present invention, a new IC card is provided which has more contact positions than standard PCMCIA IC cards, and yet which is mateable to present standard PCMCIA hosts, and which can utilize present IC card connector designs. The new IC card includes a frame that holds upper and lower card connectors that are the same or similar to standard PCMCIA connectors, with two rows of 34 contact positions in each card connector. The card frame has slots to enable it to be inserted into a stack of host connectors that includes at least two host connectors. When the new IC card is inserted into the stack of host connectors, the upper and lower standard card connectors mate with upper and lower host connectors of the stack.

An electronic device that holds the stack of at least two card-receiving hosts, has two circuits which can be connected alternately between host contacts. At least one switch of a modified host stack can sense keys formed in the new card frame, so the new card identifies itself and the electronic device can switch the connections of the two host connectors from one circuit to another.

The novel features of the invention are set forth with particularity in the appended claims. The invention will be best understood from the following description when read in conjunction with the accompanying drawings.

BRIEF DESCRIPTION OF THE DRAWINGS

FIG. 6 is an exploded partial isometric view of the IC card of FIG. 2.

FIG. 7 is a view taken on line 7—7 of the IC card of FIG. 2, showing it installed a host stack.

FIG. 8 is an exploded view of a portion of the IC card and host stack of FIG. 7.

DESCRIPTION OF THE PREFERRED EMBODIMENTS

Figure 1:
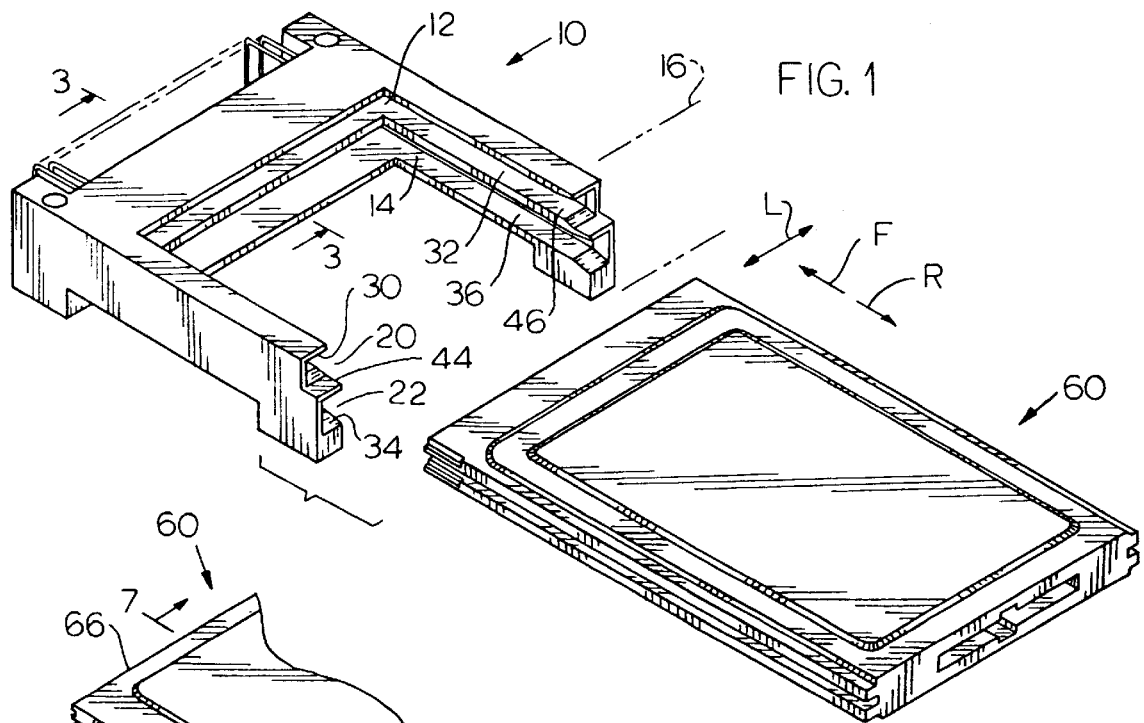
FIG. 1 is an exploded rear isometric view of a host stack and of a new IC card constructed in accordance with the present invention.
Figure 3:
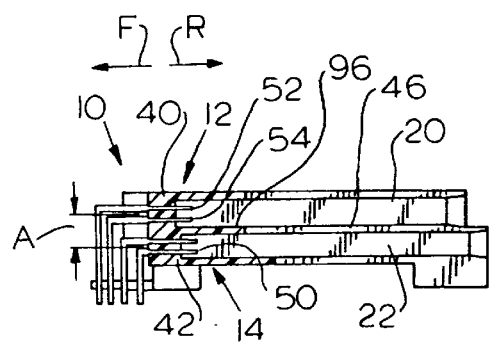
FIG. 3 is a view taken on line 3—3 of FIG. 1, showing the host stack thereof.

FIG. 1 illustrates a host stack 10 which includes a pair of card-receiving hosts 12, 14, and which is available in the prior art. The host stack 10 is part of an electronic device 16 that communicates through the host stack to IC cards. Each host includes a guideway 20, 22 with laterally-spaced (in directions L) opposite edge guides 30, 32, 34, 36, for receiving an IC card moved in a forward longitudinal direction F. As also shown in FIG. 3, each host has a host connector 40, 42 at a rear end of a corresponding guideway 20, 22. The host stack includes a mid guide wall 44, 46 located at the opposite sides and separating the upper and lower guideways.

Prior host stacks of the type shown at 10, are designed to receive standard PCMCIA (Personal Computer Memory Card International Association) type I or type II cards, which are substantially identical except that the type II card is slightly thicker (5 mm) than the type I card (3.3 mm). It is very often useful for electronic devices to interact with two IC cards at once or to store one while interacting with another, and the host stack 10 permits this. According to PCMCIA standards, each host connector 40, 42 has 68 contact positions 50 located in two rows 52, 54 of 34 contact positions each, with the contact positions being spaced apart at 1.25 mm along each row. This standard permits any type I or II card to be mated with any standard host, while permitting up to 68 mating contacts. It is noted that a contact may not lie at every contact position.

More recent advances in the design of IC cards has led to the occasional need for an IC card with more than the standard 68 contacts now prescribed in PCMCIA specifications, and which, of course, must mate to a host with more than 68 contacts. One solution would be to develop a card with three or more rows of contacts or with more than 34 contacts in a row, and to develop a similar host. This would have the disadvantage that an electronic device that was capable of connecting to standard cards of current PCMCIA specifications as well as the new card, would require an additional host which occupies additional area and adds cost Also, tooling currently built to manufacture standard card and host contacts with 68 contact positions each, could not be used to manufacture the new standard host and card contacts.

Figure 2:
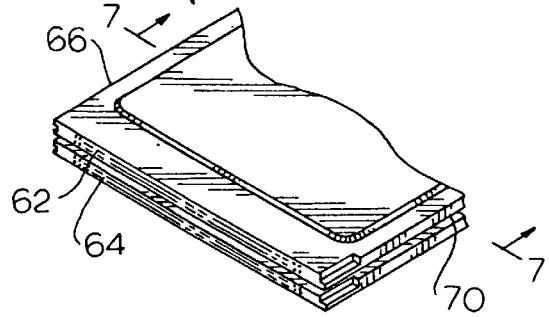
FIG. 2 is a partial front isometric view of the IC card of FIG. 1.

In accordance with the present invention, applicant provides a new IC card 60 (FIG. 2) which has much more than the standard 68 contact positions, which can be installed in a prior art host stack 10, and which can be manufactured at moderate cost The new IC card 60 includes two standard card connectors 62, 64 that are vertically spaced and held together by a frame 66. The IC card 60 essentially has the dimensions of two type II PCMCIA cards, and when inserted into the host stack 10, occupies two hosts 12, 14.

Figure 4:
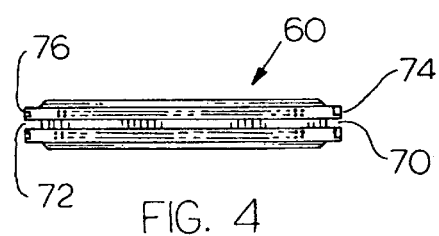
FIG. 4 is a front elevation view of the IC card of FIG. 2.
Figure 5:
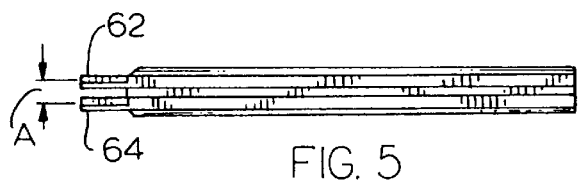
FIG. 5 is a side elevation view of the IC card of FIG. 2.

In order to permit insertion of the IC card 60 into the host stack 10, the card frame 66 is provided with a slot 70, 72 (FIG. 4) on each side 74, 76 of the card, which preferably extends by at least about half the card length. As shown in FIG. 7, when the IC card 60 is inserted into the host stack 10, each slot 70, 72 receives a corresponding mid guide wall 44, 46 of the host stack. The spacing distance A (FIGS. 3 and 5) between the card connectors 62, 64 is equal to the spacing distance between the host connectors. To this end, a predetermined spacing distance A is required for all host stacks which will receive the new IC card 60. A commonly used spacing of card-receiving hosts 12, 14 in host stacks is 6 mm, as a result of the mid guide walls 44, 46 having a thickness of about 0.75 mm, and applicant prefers this spacing. In some host stacks, the lower host connector such as 42 lies slightly rearward of the upper host connector such as 40, and a predetermined relative position for the host connectors is required to fully receive applicants new card. However, it is much easier to standardize the spacing of hosts of the kind that are presently widely used, than to require an entirely different host construction for a new card. It is possible to enable one of the card connectors to deflect slightly to accommodate slight variations in spacing, although this could add expense and decrease the sturdiness of the card.

FIG. 6 is a partial exploded view of an IC card 60 of a particular embodiment of the invention. The card frame or housing 66 includes a plastic molded frame part 80 and a sheet metal (e.g. stainless steel) electrically conductive cover 82. The plastic molded frame part 80 is shown as including two halves 84, 86, although a one-piece frame part can be used. Each frame part such as 84 includes upper and lower front end parts 90, 92 that are each designed to fit into a keyed host side. A slot 94 separates the upper and lower front parts, to receive a mid guide wall during card insertion, and to receive a separator wall 96 (FIG. 3) at the rear of the host stack which separates the two host connectors of the host stack. The separator wall 96 is shown as a continuation of the mid walls 44, 46. As shown in FIG. 6, the two card connectors 62, 64 are each mounted on two front end parts of the card frame, with the upper connector mounted on front end parts 90, 91 and the lower connector mounted on front end parts 92, 93. Each card connector can be mounted by any of a variety of fastening devices, such as by tongue-and-groove parts formed on each connector and a pair of front end parts, supplemented by adhesive. The space 100 between the front portions of the card connectors is left empty to receive the rear separator wall of the host stack.

The IC card is shown as including circuitry 101 that includes a circuit board 102 that supports various electrical components 104 that may range from integrated circuits, lasers, antenna mounts, and small disk drives. The circuit board 102 has a multiplicity of conductive traces 104 that are shown arranged in two laterally-extending rows 106, 108. The lower card connector 64 has socket contacts 110 with lower tails 112 of a common design, for solder joining to the first row 106 of circuit board traces. The upper card connector 62 is shown as having a common design for its connector housing 120, but with socket contacts 122 having long tails 124. The upper tails 124 are bent so they reach the second row 108 of contacts on the circuit board. Each frame part is shown as having platforms 130 against which the circuit board 102 lies and to which the board is mounted. A vertically-extending connector portion 132 of each frame part such as 80 connects upper and lower frame parts such as 141, 143, of which the front frame parts 91, 93 are portions.

As shown in FIG. 7, the cover 82 extends into the spaces between the upper and lower frame parts 141, 143 at each side of the card, to leave the slots 70, 72. A wide variety of card constructions can be employed, as where the card connectors form the front end parts 90–93 of the card frame and are attached to the metal cover 82, without requiring a molded plastic frame between them.

Figure 9:
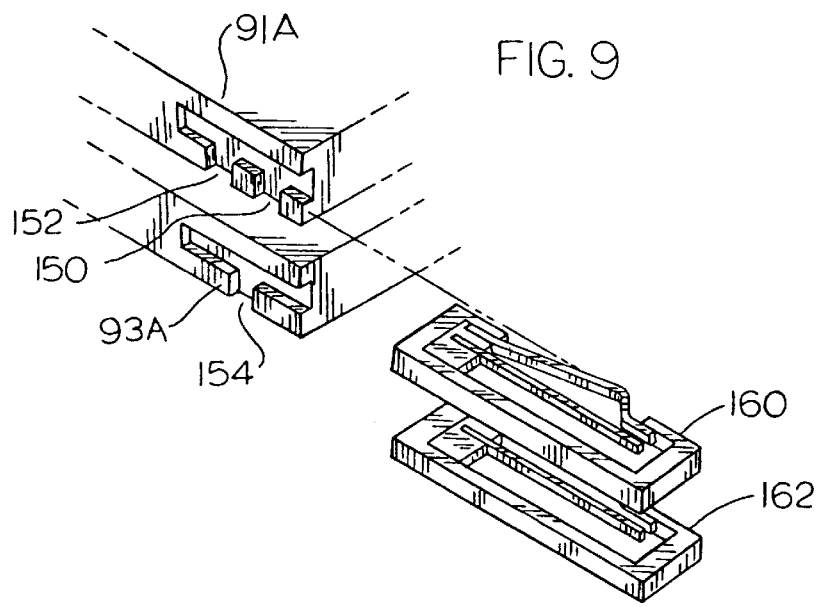
FIG. 9 is a partial isometric exploded view of an IC card and host stack constructed in accordance with another embodiment of the invention.

It is often convenient to construct an electronic device that includes the host stack, so it can connect certain circuitry to each host connector when a type I or type II standard card is inserted, or can connect other circuitry to the host connectors when applicant's new IC card 60 is installed, which applicant can refer to as a type IV card. Such switching can be accomplished manually as by an external push button switch. It is usually desirable if such switching is accomplished automatically. FIG. 9 shows an example where the upper and lower front end parts 91A, 93A of applicant's card have been altered to provide gaps 150, 152, 154. A pair of switches 160, 162 mounted on the host stack, sense the insertion of applicant's type IV card, to connect selected circuitry to the host connectors.

Figure 10:
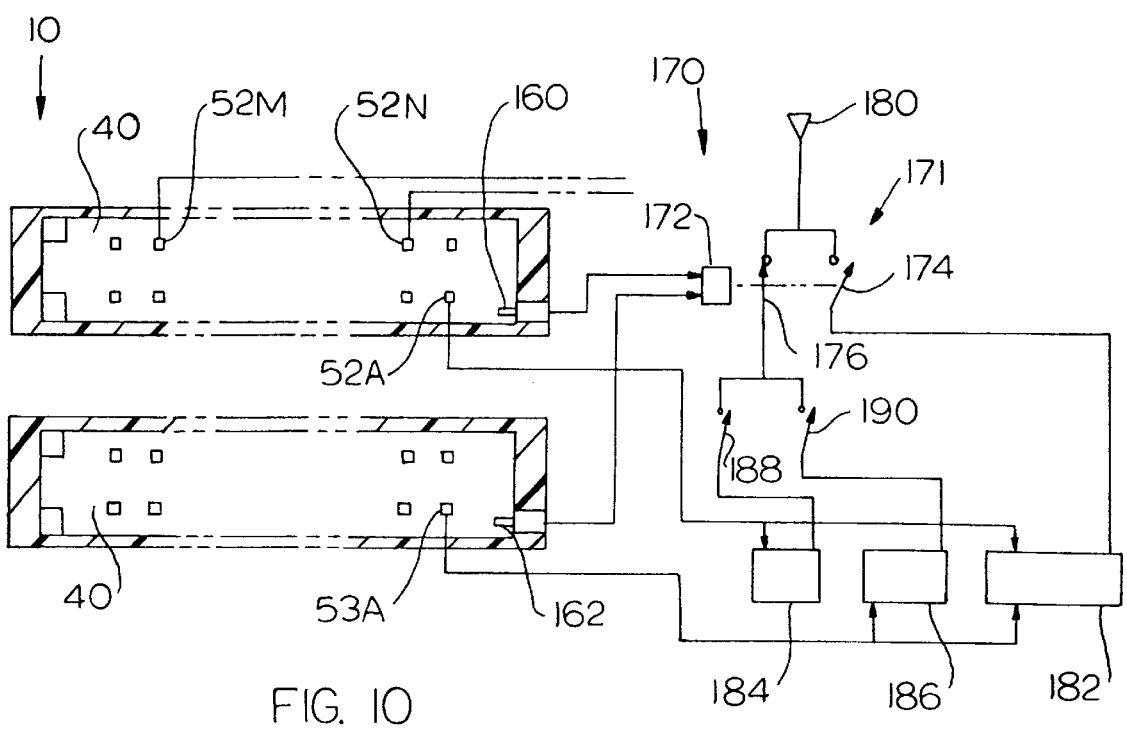
FIG. 10 is a diagrammatic view of the host stack of FIG. 9 and of circuitry of an electronic device which includes the host stack.

FIG. 10 shows one example of an electronic device 170 which includes the switches 160, 162 that detect keys along one edge of applicant's IC card as the upper and lower card connectors approach the host connectors 40, 42. The switches are connected to a switching apparatus 171 which includes a logic circuit 172 that operates a pair of switches to close one 174 and open the other 176 when the logic circuit 172 detects applicants type IV IC card. Upon switch 174 being closed, current from a voltage source 180 passes through switch 174 to an alternate circuit 182 instead of circuits 184 or 186 (which are energized when a type I, II or III card is inserted). Pins such as 52A and 53A of the two host connectors are connected to the circuit 182 and one of the circuits 184, 186, but only that circuit which is activated will transmit or receive signals passing along the contacts 52A, 53A. When two pins such as 52M and 52N sense an inserted card in one host, switches such as 188, 190 can be closed to energize circuits 184 and/or 186.

Thus, the invention provides an IC card which has more than the standard 68 contact positions of a PCMCIA card, and yet which is "backward compatible" with standard PCMCIA hosts arranged in a stack. Also, applicants IC card can use card connectors of a type designed for use in standard IC cards with only 68 contact positions. This is accomplished by an IC card with two card connectors that are each mateable with standard host connectors that each have 68 contact positions where contacts can lie. A frame that holds the card connectors, provides slots at either side of the frame, extending longitudinally along at least the front portion of the card, to receive a mid guide wall that commonly separates guideways of two hosts of a stack. Also, the card preferably has a slot at its front end between the upper and lower card connectors, to accommodate a rear separator wall of a host stack, which separates vertically spaced host connectors. The card can include a circuit board with traces that are coupled to contacts of both the upper and lower card connectors. An electronic device that holds the host stack, can include circuitry that connects the host connector contacts to one of a plurality of circuits and/or that energizes a selected one of the circuits, depending upon whether a type I or II (or even type III) IC card has been installed, or whether applicant's type IV IC card has been installed. The circuits can be automatically switched by a logic circuit that responds to at least one switch that senses keys formed in front end portions of applicant's IC card.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An IC card which can be inserted simultaneously into upper and lower card-receiving hosts arranged in a host stack, wherein each of said hosts has a guideway with laterally-spaced opposite edge guides, and each host has a host connector at a rear end of the corresponding guideway, said host stack including at least one mid guide wall located at each of said opposite sides and lying vertically between a pair of said edge guides, comprising:

a card frame having front and rear ends, laterally-spaced opposite sides, and upper and lower frame portions;

a circuit assembly mounted on said card frame, including at least a first circuit board;

upper and lower card connectors mounted on said card frame upper and lower frame portions and being mateable to said first and second host connectors;

said card frame having a slot at each of its sides, between said upper and lower frame portions, with said slots being constructed to receive said mid guide walls.

2. The IC card described in claim 1 wherein the guideway of each of said hosts has a rear separator wall which projects forward of at least one of said host connectors and which extends at least partially between said opposite sides of said guideways, and wherein:

said card has a front slot lying between said upper and lower connectors, for receiving said at least one rear separator wall.

3. The IC card described in claim 1 wherein:

said first circuit board has a front portion with a multiplicity of conductive traces;

said upper and lower card connectors have at least one laterally-extending row of contacts, with a plurality of contacts of said upper card connector and a plurality of contacts of said lower connector each having contact tails connected to said conductive traces on said circuit board.

4. A method for constructing a new IC card with more than 68 contacts, but which is mateable to card-receiving hosts which have standard PCMCIA host connectors that each includes 68 contact positions arranged in two laterally-extending rows of 34 contact positions each and wall surfaces forming laterally opposite edge guides extending longitudinally forward of said connectors, wherein said hosts are available in stacks that each includes at least two hosts with their host connectors vertically spaced, comprising:

constructing a new IC card by mounting two card connectors on a card frame where each card connector is mateable to one of said PCMCIA 68-pin host connectors, and said card connectors are spaced to each mate with a different one of said host connectors at the same time.

5. The method described in claim 4 wherein:

said step of constructing said card frame includes constructing it with a pair of laterally-spaced sides that each have a longitudinally-extending grooves to receive said edge guides.

6. An IC card that is mateable to hosts of a stack of hosts that each has a host connector with a predetermined number of contact positions, comprising:

a card housing;

a pair of card connectors mounted on said housing, each card connector having said predetermined number of contact positions and each card connector being positioned to mate with one of said host connectors;

a card circuit connected to contacts of each of said card connectors;

said card housing holding said card connectors and said card circuit in the form of a single IC card with said card connectors positioned so they can both simultaneously remain mated to two of said host connectors of said stack.

7. A method for constructing a new IC card with more than a predetermined number of contacts, but which is mateable to card-receiving hosts which have host connectors that each includes said predetermined number of contact positions and wall surfaces forming laterally opposite edge guides extending longitudinally forward of said connectors, wherein said hosts are available in stacks that each includes at least two hosts with their host connectors vertically spaced, comprising:

constructing a new IC card by mounting two card connectors on a card housing where each card connector is mateable to one of said host connectors, and said card connectors are spaced to each mate with a different one of said host connectors at the same time.

8. The method described in claim 7 wherein:

said step of constructing said card frame includes constructing it with a pair of laterally-spaced sides that each has a longitudinally-extending groove to receive one of said edge guides.

9. The method described in claim 7 wherein:

forming a circuit in said card housing which is connected to contacts of both of said card connectors, so currents pass between said circuit and said contacts of both of said connectors when said card connectors are connected to said host connectors.

* * * * *